United States Patent
Castleberry

(10) Patent No.: US 6,483,115 B1
(45) Date of Patent: Nov. 19, 2002

(54) METHOD FOR ENHANCING SCINTILLATOR ADHESION TO DIGITAL X-RAY DETECTORS

(75) Inventor: Donald Earl Castleberry, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 41 days.

(21) Appl. No.: 09/707,821

(22) Filed: Nov. 8, 2000

(51) Int. Cl.⁷ .............................................. H01L 31/055
(52) U.S. Cl. ................. 250/370.11; 250/363.2; 250/367; 250/370.09
(58) Field of Search ......................... 250/370.11, 363.2, 250/367, 370.09

(56) References Cited

U.S. PATENT DOCUMENTS 4,906,850 A  *  3/1990  Beerlage ................. 250/370.09
5,401,668 A  *  3/1995  Kwasnick et al.
5,463,225 A  *  10/1995  Kwasnick et al.
6,278,118 B1 *  8/2001  Homme et al. ......... 250/370.09

OTHER PUBLICATIONS

Radiation Imaging with Continuous Polymer Layer for Scintillator, 09/411,299, Oct. 4, 1999, (RD26,271), Ching–Yeu Wei et al.*
Methods and Apparatus for Depositing Scintillator Material on Radiation Imager, 09/195,656, Nov. 19, 1998, (RD–25, 057), Reinhold Franz Wirth.*

* cited by examiner

Primary Examiner—Constantine Hannaher
Assistant Examiner—Andrew Israel
(74) Attorney, Agent, or Firm—Enrique Abarca; Patrick K. Patnode

(57) ABSTRACT

The present invention provides a process and apparatus for forming a high integrity imager device having a passivation layer disposed over a photosensor array, a passivation layer with an adhesion topography on its surface, and a scintillator layer disposed over the passivation layer such that the scintillator layer is coupled to the adhesion topography.

39 Claims, 3 Drawing Sheets

METHOD FOR ENHANCING SCINTILLATOR ADHESION TO DIGITAL X-RAY DETECTORS

BACKGROUND OF THE INVENTION

This invention relates generally to digital imaging, and more particularly to x-ray detector imaging.

Radiation imagers, such as digital x-ray imagers, typically include a scintillator coupled to a photosensor array. The radiation to be detected, x-rays for example, are absorbed by the scintillator material with the release of electrons which are converted to optical photons inside the scintillator that in-turn are detected by photodiodes which accumulate charge corresponding with the incident photons. The charge is read out by drive electronics to provide electrical signals corresponding to the radiation image. The data embodied in such electrical signals can be presented in a visual display or otherwise processed to allow analysis of the radiation pattern.

Optimal array performance depends on, among other things, good adhesion between the scintillator layer and the underlying photosensor array. When CsI is evaporated on the surface of a passivation layer, for example, thermal expansion results in forces that tend to peel the CsI layer from the surface of the passivation layer over the photosensor array. As a result, attempts have been made to increase the adhesion of evaporated CsI to a photosensor array; approaches include etching the surface of the underlying passivation layer, typically comprising of $Si_3N_4$ (generally referred to as SiN), or adding a buffer layer of polyimide over the photosensor array. While these attempts have been successful within certain temperature ranges, adhesion problems begin to develop at extreme temperature ranges beyond −20 degrees Celsius to +70 degrees Celsius.

There are a number of factors that affect the reliability of the adhesion between CsI and the substrate. For example, a large stress on the CsI-substrate interface may result because of the difference in coefficient of thermal expansion between CsI (typically having a large thickness of 100 to 600 microns($\mu$m)) and the imager glass substrate. Attempts to structure the surface under the CsI layer have consisted, for example, of depositing a thick (~5 $\mu$m) polyimide layer over the photodiode to form a platform on which the CsI is deposited; nevertheless, such attempts have not always provided the desired level of adhesion.

Accordingly, there is a need in the art for a radiation imager having good adhesion between the scintillator and photodiode array.

SUMMARY OF THE INVENTION

The present invention provides a process and apparatus for forming a high integrity imager device having a passivation layer disposed over a photosensor array, a passivation layer with an adhesion topography on its surface, and a scintillator layer disposed over the passivation layer such that the scintillator layer is coupled to the adhesion topography.

DETAILED DESCRIPTION OF THE INVENTION

Figure 1:
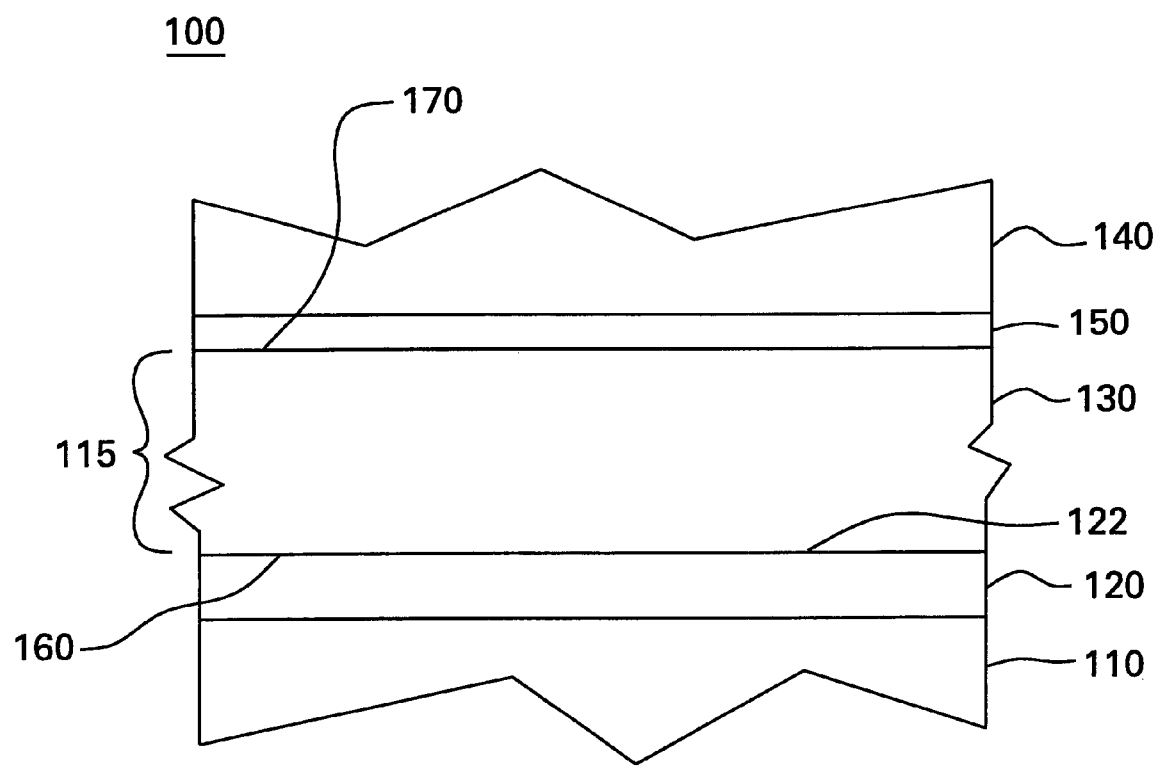
FIG. 1 is a schematic, cross-sectional view of one embodiment of the instant invention.

FIG. 1 is a schematic, cross-sectional view of a portion of a radiation imager 100. Radiation imager 100 typically comprises a photosensor array 120 disposed on a substrate 110. A scintillator 140 is optically coupled to photosensor array 120. "Optically coupled" as used herein, refers to the disposition of scintillator 140 and photosensor array 120 so that optical photons from scintillator 140 readily pass from scintillator 140 into photosensor array 120. A protective cover plate (not shown) is disposed over scintillator 140 so as to protect scintillator 140 from exposure to ambient conditions.

FIG. 1 depicts a passivation layer 115, typically comprising one or more passivation tiers (e.g. a first tier 130 and a second tier 150), that is disposed on photosensor array 120. As used herein, "on", "over", "above", "under" and the like are used to refer to the relative location of elements of imager 100 as illustrated in the figures and is not meant to be a limitation in any manner with respect to the orientation or operation of imager 100. One characteristic of passivation layer 115 is that it be optically transmissive so that light generated in the scintillator layer reaches photosensor array 120. "Optically transmissive" as used herein, is the characteristic of the passivation layer 115 to allow light to reach photosensor array 120 through passivation layer 115. Passivation layer 115 typically has an optical transmission (that is, passes right through passivation layer 115) in the range between about 60% and about 100%. Such optically transmissive layers, for example, may comprise but are not limited to, SiN and $SiO_2$. These passivation materials also prevent moisture, for example, from reaching photosensor array 120 and aid in maintaining adhesion to the underlying structures.

In one embodiment, passivation layer 115 typically comprises a first tier 130 and a second tier 150. For example, passivation layer first tier 130 typically comprises SiN and passivation layer second tier 150 comprises $SiO_2$. The SiN tier is typically non-stoichiometric ($Si_{3X}N_{4(1-X)}$ with X only approximately equal to 1) but it may also be stoichiometric $Si_3N_4$ (hereinafter referred to as SiN). The SiN tier has a thickness in the range between about 0.1 $\mu$m and about 5 $\mu$m. The $SiO_2$ tier has a thickness in the range between about 0.1 $\mu$m and about 2 $\mu$m. Passivation layer first tier first surface 160 is disposed over photosensor array first surface 122 and passivation layer second tier 150 is disposed in contact with passivation layer first tier second surface 170.

Figure 2:
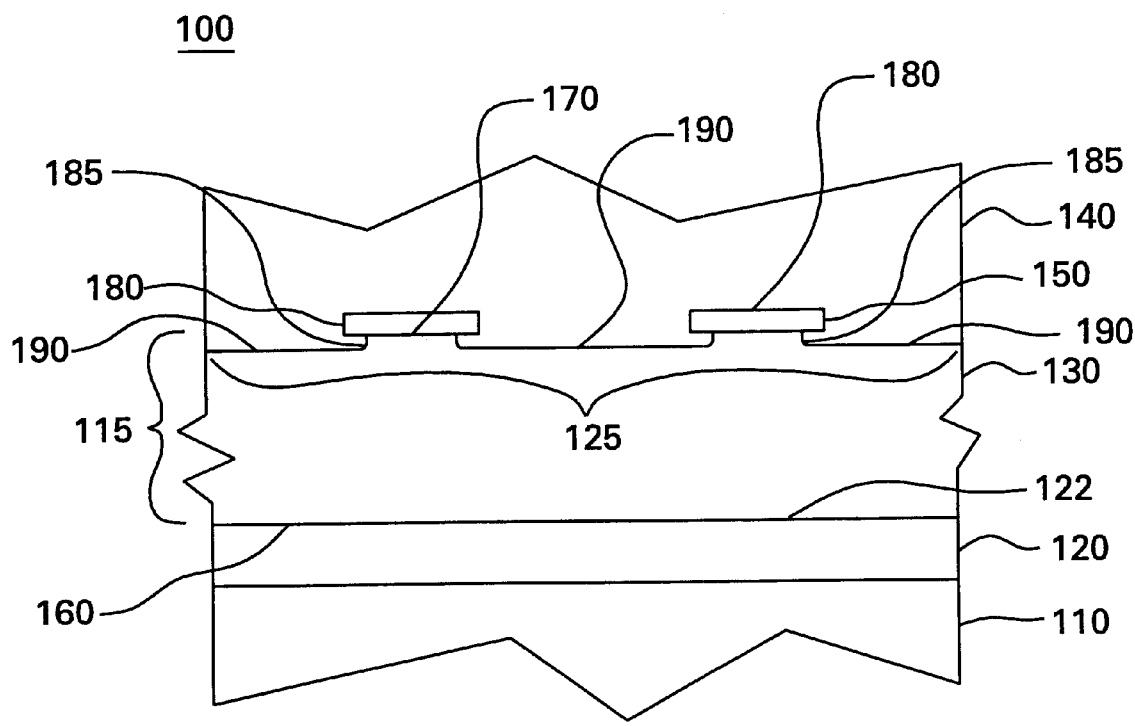
FIG. 2 is a schematic, cross-sectional view of another embodiment of the instant invention.

FIG. 2 depicts an adhesion topography 125 comprising a plurality mesa tops 180 and a plurality of depressions 190 formed within passivation layer 115. Adhesion topography 125 is created when etchants are used to etch mesa tops 180 and depressions 190 on passivation layer 115. Evaporated scintillator material 140 is attached to passivation layer 115 adhesion topography 125 by scintillator material 140 being disposed within depressions 190 formed by the etched out area. Mesa tops 180 are disposed between respective depressions 190 and are either flush with or extend beyond the underlying sidewalls 185 of depressions 190. The shape (in plan view) of mesa tops 180, for example, includes square, circular, rectangular, or irregular shapes.

Figure 3:
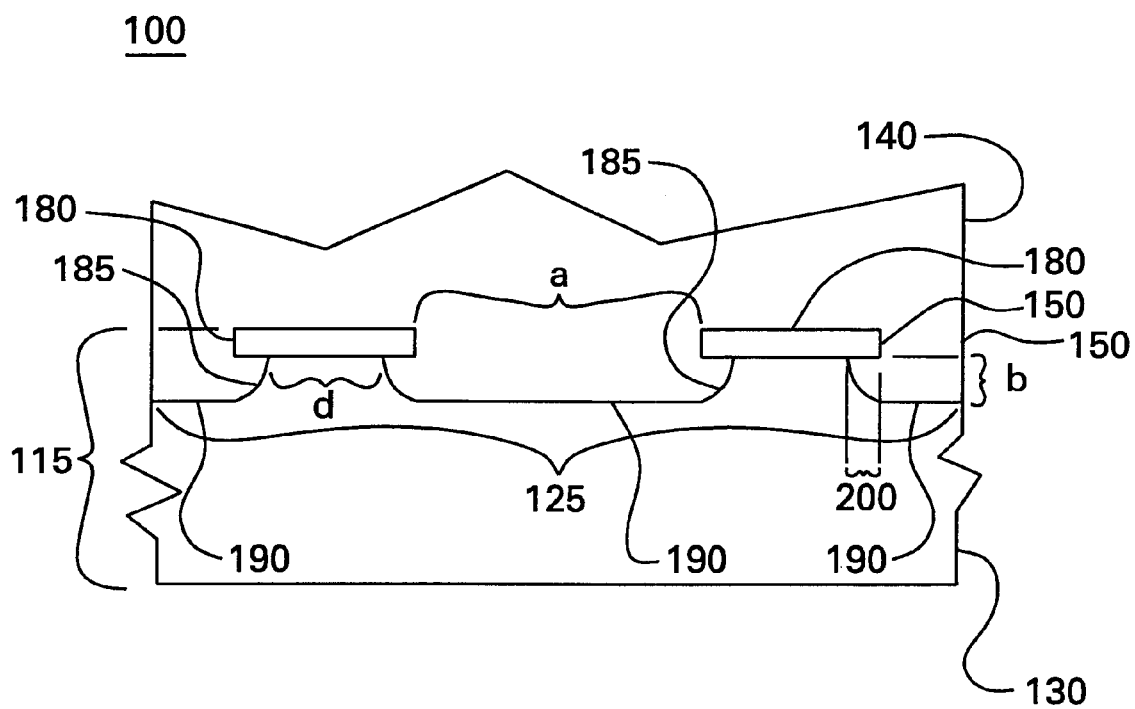
FIG. 3 is a schematic, cross-sectional view of another embodiment of the instant invention.

Adhesion topography 125 is typically formed by first using photolithography steps to etch mesa tops 180 in passivation layer 115 (FIG. 3). For example, one method of etching includes etching passivation layer second tier 150 using an etchant that does not etch passivation layer first tier 130, leaving portions of passivation layer second tier 150 that will constitute mesa top 180 structure. The distance "a" between the respective edges of adjacent mesa tops 180 is typically in the range between about 2 μm and about 500 μm. Next, passivation layer first tier 130 is partially etched to a depth "b" of about 0.1 μm, using an etchant that does not etch passivation layer second tier 150, leaving a depression 190 in passivation layer first tier 130. As a result, an undercut 200 is created extending under mesa top 180 surface. Typical etchants used for etching passivation layer 115 comprise hydrofluoric acid or plasma etching. The edge of undercut 200 is either flush with or is recessed beyond the edge of mesa top 180. The length of mesa top 180 undercut 200 is typically in the range between about 0 μm and about 1 μm. The distance "d" between adjacent depressions 190 is typically in the range between about 5 μm and about 500 μm.

Alternatively, another method of etching involves using at least one etchant that etches passsivation layer first tier 130 material much faster than passivation layer second tier 150 material. Thus, once passivation layer second tier 150 material is etched through, passivation layer first tier 130 material etches quickly creating an undercut 200 under mesa top 180 left by passivation layer second tier 150 material etching. For SiN and $SiO_2$ materials, for example, a liquid dilute hydrofluoric acid can etch SiN much faster than $SiO_2$; the relative etch rates of the two materials depend on the stoichiometry of the SiN (since SiN may be $Si_{3x}N_{4(1-x)}$).

In another embodiment of this invention, passivation layer first tier 130 comprises either SiN or $SiO_2$ and passivation layer second tier 150 comprises a polyimide layer. Polyimides are polymer materials that are widely used in semiconductor devices that are heated without decomposing. For example, a 0.5 μm thick polyimide layer is spin coated on top of passivation layer first tier 130. Polyimide layer (passivation layer second tier 150) is etched by a plasma etch process, for example, to achieve mesa top 180 pattern desired. Next, passivation layer first tier 130 is etched with a dilute hydrofluoric acid, for example, that does not etch the polyimide layer leaving undercut 200 under mesa top 180 structure.

As a result, adhesion topography 125 of the high integrity imager device 100 passivation layer 115 surface is defined by a series of depressions 190 and a series of mesa tops 180, disposed between depressions 190, which in conjunction allow the deposition of scintillator material 140 into depression 190. "High integrity," as used herein, is defined as the disposition of the scintillator material 140 over the surface of mesa tops 180 as well as into depressions 190 provides a high integrity bond between scintillator 140 and the underlying passivation layer 115. As a result, there is little or no mechanical deterioration, peeling or motion of the bond between scintillator 140 and adhesion topography 125 at extreme temperature ranges typically between about −20 degree Celsius and about 70 degrees Celsius. For example, the structure should pass the standard tape pull test (wherein the adhesive tape is applied to the structure and pulled off, as is known in the art) without peeling or delamination.

It will be apparent to those skilled in the art that, while the invention has been illustrated and described herein in accordance with the patent statutes, modification and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A process for forming a high integrity imager device, comprising the steps of:

forming an adhesion topography in a passivation layer surface, said adhesion topography comprising an upper surface of said passivation layer; and depositing a scintillation layer on said passivation layer surface.

2. A process for forming a high integrity, imager device in accordance with claim 1, wherein said adhesion topography comprises depressions formed within said passivation layer and a plurality of mesa tops disposed between said depressions.

3. A process for forming a high integrity imager device in accordance with claim 1, wherein the distance between adjacent ones of said mesa tops is in the range between about 2 μm and about 500 μm.

4. A process for forming a high integrity imager device in accordance with claim 2, wherein the distance between adjacent ones of said depressions is in the range between about 2 μm and about 5 μm.

5. A process for forming a high integrity imager device in accordance with claim 1, wherein said scintillation layer comprises Cesium Iodide.

6. A process for forming a high integrity imager device in accordance with claim 2, wherein said scintillation layer is disposed within said depressions and over said mesa tops.

7. A process for forming a high integrity imager device in accordance with claim 1, wherein the steps of forming said adhesion topography comprises the steps of:

forming a $1^{st}$ passivation tier, said $1^{st}$ passivation tier having a respective $1^{st}$ and $2^{nd}$ surface;

depositing a $2^{nd}$ passivation tier, having a respective $1^{st}$ and $2^{nd}$ surface, on said $1^{st}$ passivation tier, said $2^{nd}$ passivation tier $1^{st}$ surface is in contact with said $1^{st}$ passivation tier $2^{nd}$ surface;

etching said $2^{nd}$ passivation tier to form a plurality of mesa tops therein, said mesa tops having a depth from said $2^{nd}$ passivation tier $2^{nd}$ surface to said $2^{nd}$ passivation tier $1^{st}$ surface; and etching said $1^{st}$ passivation tier second surface to form a plurality of depressions in the region between said mesa tops.

8. A process for forming a high integrity imager device in accordance with claim 7, wherein the step of forming said depressions includes etching said first passivation layer such that sidewalls of said depressions are flush with said overlying mesa tops or extend beneath said mesa tops creating an undercut portion.

9. A process for forming a high integrity imager device in accordance with claim 8, wherein said undercut has a length in the range between about 0 μm and about 1 μm.

10. A process for forming a high integrity imager device in accordance with claim 7, wherein said $1^{st}$ passivation tier and said $2^{nd}$ passivation tier respectively comprise of two different passivation materials.

11. A process for forming a high integrity imager device in accordance with claim 7, wherein said $2^{nd}$ passivation tier comprises a polyimide layer.

12. A process for forming a high integrity imager device in accordance with claim 7, wherein said $2^{nd}$ passivation tier comprises a $SiO_2$ layer.

13. A process for forming a high integrity imager device in accordance with claim 7, wherein said $2^{nd}$ passivation tier has a thickness in the range between about 0.1 μm and about 5 μm.

14. A process for forming a high integrity imager device in accordance with claim 7, wherein said $1^{st}$ passivation tier comprises a SiN layer.

15. A process for forming a high integrity imager device in accordance with claim 7, wherein said $1^{st}$ passivation tier has a thickness in the range between about 0.1 $\mu$m and about 2 $\mu$m.

16. A process for forming a high integrity imager device in accordance with claim 7, wherein a process for forming adhesion topography comprises the steps of:
   etching said $2^{nd}$ passivation tier using a $1^{st}$ etchant which etches said $2^{nd}$ passivation tier but does not etch said $1^{st}$ passivation tier; and
   etching said $1^{st}$ passivation tier using a $2^{nd}$ etchant which etches said $1^{st}$ passivation tier but does not etch said $2^{nd}$ passivation tier.

17. A process for forming a high integrity imager device in accordance with claim 16, wherein etching said $1^{st}$ passivation tier using said $2^{nd}$ etchant which etches said $1^{st}$ passivation tier but does not etch said $2^{nd}$ passivation tier comprises plasma etching.

18. A process for forming a high integrity imager device in accordance with claim 17, wherein said $2^{nd}$ etchant comprises hydrofluoric acid.

19. A process for forming a high integrity imager device in accordance with claim 7, wherein a single etchant can be used to etch said $1^{st}$ and $2^{nd}$ passivation tiers.

20. A process for forming a high integrity imager device in accordance with claim 19, said single etchant comprises hydrofluoric acid.

21. A radiation imager comprising:
   a passivation layer having an adhesion topography, said adhesion topography comprising an upper surface of said passivation layer; and
   a scintillation layer disposed over said adhesion topography.

22. A radiation imager in accordance with claim 21, wherein said passivation layer adhesion topography comprises depressions formed within said passivation layer and a plurality of mesa tops disposed between said depressions.

23. A radiation imager in accordance with claim 21, wherein said passivation layer comprises:
   a $1^{st}$ passivation tier, having a respective $1^{st}$ and $2^{nd}$ surface, said $1^{st}$ passivation tier having a plurality of depressions; and
   a $2^{nd}$ passivation tier, having a respective $1^{st}$ and $2^{nd}$ surface, wherein said $2^{nd}$ passivation tier $1^{st}$ surface is in contact with said $1^{st}$ passivation tier $2^{nd}$ surface, said $2^{nd}$ passivation tier forming a plurality of mesa tops.

24. A radiation imager in accordance with claim 23, wherein said $1^{st}$ passivation tier and said $2^{nd}$ passivation tier respectively comprise different passivation materials.

25. A radiation imager in accordance with claim 24, wherein said $2^{nd}$ passivation tier material comprises a polyimide layer.

26. A radiation imager in accordance with claim 24, wherein said $2^{nd}$ passivation tier material comprises a $SiO_2$ layer.

27. A radiation imager in accordance with claim 24, wherein said said $1^{st}$ passivation tier comprises a SiN layer.

28. A radiation imager in accordance with claim 23, wherein said $2^{nd}$ passivation tier thickness is in the range between about 0.1 $\mu$m and about 2 $\mu$m.

29. A radiation imager in accordance with claim 23, wherein said said $1^{st}$ passivation tier thickness is in the range between about 0.1 $\mu$m and about 5 $\mu$m.

30. A high integrity radiation imager comprising:
   a passivation layer having an adhesion topography, said adhesion topography comprising an upper surface of said passivation layer; and
   a scintillation layer disposed over said adhesion topography,
   wherein said adhesion topography comprises a plurality of mesa tops and depressions.

31. A high integrity radiation imager in accordance with claim 30, wherein said adhesion topography comprises mesa tops disposed between said depressions.

32. A high integrity radiation imager in accordance with claim 30, wherein the distance between adjacent ones of said mesa tops is in the range between about 2 $\mu$m and about 500 $\mu$m.

33. A high integrity radiation imager in accordance with claim 30, wherein shape of said mesa tops are square, circular, rectangular or irregular.

34. A high integrity radiation imager in accordance with claim 30, wherein the distance between adjacent ones of said depressions is in the range between about 5 $\mu$m and about 500 $\mu$m.

35. A high integrity radiation imager in accordance with claim 30, wherein sidewalls of said depressions are flush with said mesa tops.

36. A high integrity radiation imager in accordance with claim 30, wherein sidewalls of said depressions extend beneath said mesa tops creating an undercut portion.

37. A high integrity radiation imager in accordance with claim 30, wherein said undercut has a length in the range between about 0 $\mu$m and about 1 $\mu$m.

38. A high integrity radiation imager in accordance with claim 30, wherein said scintillation layer comprises Cesium Iodide.

39. A high integrity radiation imager in accordance with claim 30, wherein said scintillation layer is disposed within said depression and over said mesa tops.

* * * * *